United States Patent [19]

Nilssen

[11] 4,441,087
[45] Apr. 3, 1984

[54] HIGH EFFICIENCY INVERTER & BALLAST CIRCUITS

[76] Inventor: Ole K. Nilssen, Caesar Dr. - Rte. 4, Barrington, Ill. 60010

[21] Appl. No.: 330,599

[22] Filed: Dec. 14, 1981

Related U.S. Application Data

[63] Continuation of Ser. No. 973,741, Dec. 28, 1978, abandoned, which is a continuation-in-part of Ser. No. 890,586, Mar. 20, 1978, Pat. No. 4,184,128.

[51] Int. Cl.³ .......................... H02M 7/53; H03K 3/30
[52] U.S. Cl. .................................. 331/113 A; 363/22; 363/133
[58] Field of Search ................ 331/113 A; 363/22–25, 363/133, 134, 123

[56] References Cited

U.S. PATENT DOCUMENTS

| | | | |
|---|---|---|---|
| 3,146,406 | 8/1964 | Wilting | 331/113 A |
| 3,161,837 | 12/1964 | Lloyd | 331/113 A |
| 3,466,570 | 9/1969 | Webb et al. | 331/113 A |
| 3,662,249 | 5/1972 | Wijsboom | 331/113 A X |
| 3,914,680 | 10/1925 | Hesler et al. | 331/113 A X |
| 4,002,999 | 1/1977 | Hesler et al. | 331/113 A |

Primary Examiner—Siegfried H. Grimm

[57] ABSTRACT

A high efficiency push-pull inverter circuit employing a pair of relatively high power switching transistors is described. The switching on and off of the transistors is precisely controlled to minimize power losses due to common-mode conduction or due to transient conditions that occur in the process of turning a transistor on or off. Two current feed-back transformers are employed in the transistor base drives; one being saturable for providing a positive feed-back, and the other being non-saturable for providing a intermittently negative feed-back.

35 Claims, 5 Drawing Figures

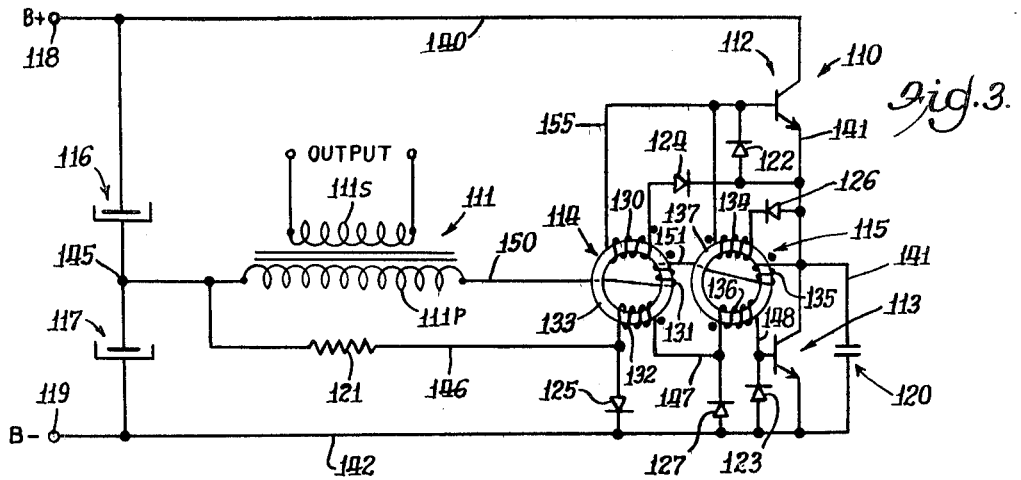
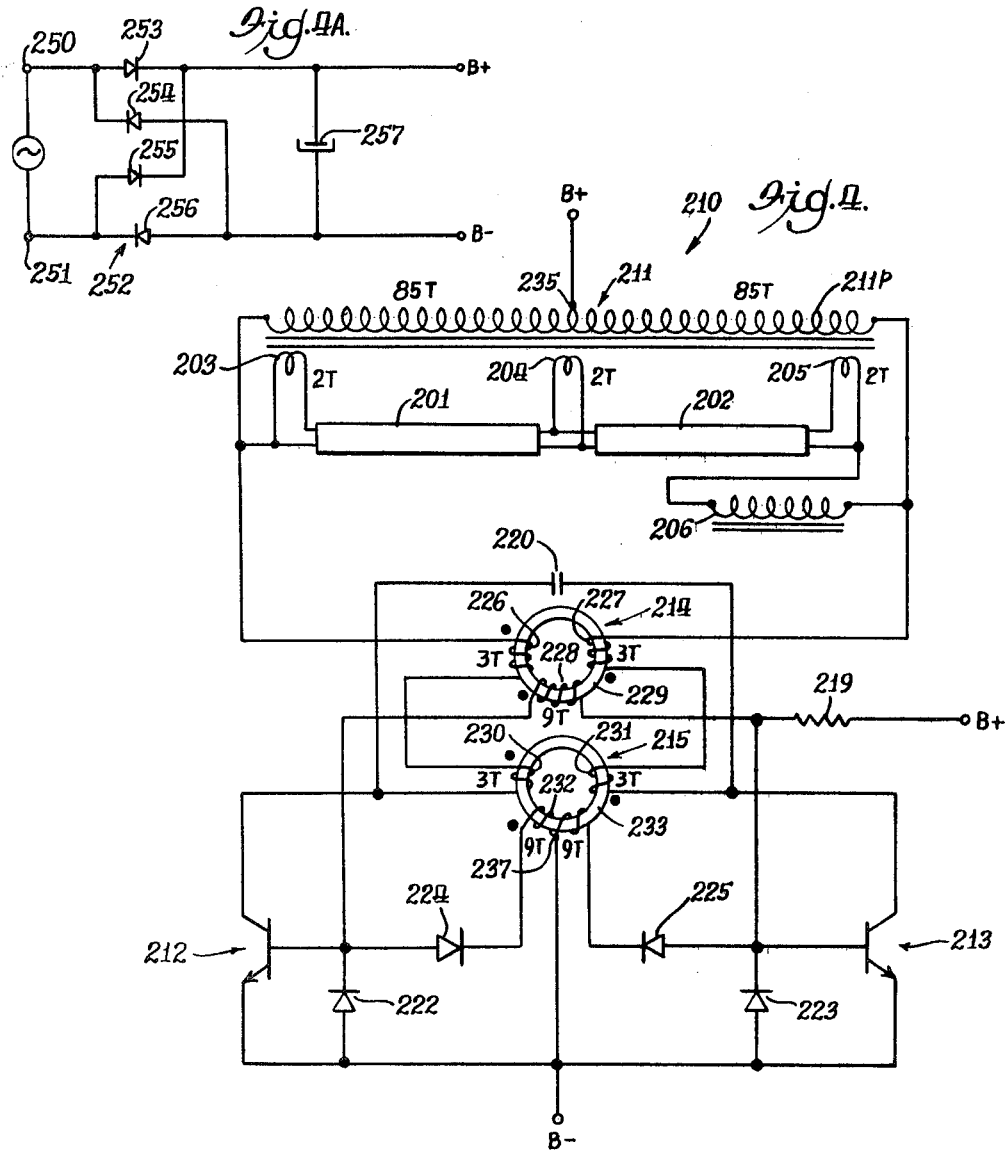

HIGH EFFICIENCY INVERTER & BALLAST CIRCUITS

CROSS REFERENCE TO RELATED APPLICATION

The present application is a continuation of application Ser. No. 973,741, filed Dec. 28, 1978, now abandoned, and which was a continuation-in-part of application Ser. No. 890,586, filed Mar. 20, 1978, and now U.S. Pat. No. 4,184,128.

BACKGROUND OF THE INVENTION

1. Field of the Invention

This invention relates generally to the field of electrical energy conversion systems and more particularly to electrical inverter circuits utilizing a solid state active element oscillator of the multivibrator type to convert DC voltage into AC voltage.

2. Description of the Prior Art

Inverter circuits, as considered herein, are designed to convert a DC input voltage into a high frequency alternating output voltage. The push-pull types of inverter circuits are recognized as the most efficient as a class for this purpose. However, even these circuits are plagued with a number of identifiable inefficiences. The most significant of these is the energy loss that occurs due to common-mode conduction. This occurs when both transistors conduct simultaneously. The simultaneous conduction in turn is the result of an inherent and unavoidable delay associated with the turn-off action of applicable transistors. Such transistors normally do not have a corresponding delay associated with the turn-on action. Attempts have been made to correct this problem by selecting transistors with the lowest possible turn-off delay but this approach has required the use of very costly transistors.

A second major cause of energy loss in such a circuit is the power dissipation that occurs within each transistor during its turn-off transition. To minimize this loss, it is important to operate each transistor at near its maximum switching speed. However, it is even more important to prevent the collector voltage from rising significantly before the transistor has been fully turned off.

A third significant cause of energy dissipation results from turning on a transistor before its collector voltage has been reduced to its minimum level. This reduction of collector voltage occurs after the other transistor has been turned off, and as a result of its rising collector voltage.

Another cause of energy loss results from power dissipation within each transistor while it is conducting. To minimize this loss, it is necessary to provide adequate base drive corresponding to the collector current flowing at any given time. However, if this base drive is in excess of what is required to control the transistor, it can in itself become a cause of unnecessary power loss.

A great deal of design work on push-pull inverter circuits has been performed by others and reported in the patent art. Examples of such circuits are described in the patent to Jensen U.S. Pat. No. 2,997,664 entitled "Saturable Core Transistor Oscillator"; the patent to Wellford U.S. Pat. No. 3,248,640 entitled "Synchronizing Circuit"; the patent to Mehwald U.S. Pat. No. 3,324,411 entitled "Transistor Inverter with Inverse Feed-Back Frequency Stabilization Control"; the patent to Bishop et al., U.S. Pat. No. 3,461,405 entitled "Driven Inverter Dead-Time Circuit"; the patent to Paget, U.S. Pat. No. 3,579,026 entitled "Lamp Ballast"; the patent to Low, U.S. Pat. No. 3,663,944 entitled "Inverter Oscillator with Voltage Feed-Back"; the patent to Cox, U.S. Pat. No. 3,691,450 entitled "Power Inverter Oscillator Circuit"; the patent to Hook, U.S. Pat. No. 3,913,036 entitled "High Power High Frequency Saturable Core Multivibrator Power Supply"; and the patent to Ghiringhelli, U.S. Pat. No. 4,016,477 entitled "Novel Multipath Leakage Transformer and Inverter Ballast". The above identified patents have recognized some of the causes of power loss within a multivibrator inverter circuit and have proposed solutions for partially correcting for these losses. However, none have recognized all of the causes of such power loss as identified herein nor have they suggested solutions for eliminating such power losses within an economical and operationally effective frame of reference. Some also employ independent oscillator or drive circuits which add to the total cost of the inverter and may be wasteful of energy in and of themselves.

Another approach to the solution of most of the identified problems has been described in my pending application entitled "High Efficiency Push-Pull Inverters", filed Mar. 20, 1978, and assigned Ser. No. 890,586. This invention employs a saturable inductor across the base-emitter junction of each transistor for providing, when saturated, a near-short circuit path for the rapid evacuation of the charge carriers stored in the junction, and thereby ensures the rapid turn-off of the respective transistor.

SUMMARY OF THE INVENTION

It is an object of the present invention to provide an improved self-oscillating, push-pull inverter circuit that is both efficient in operation and economical to manufacture. This invention is particularly advantageous in applications where the available DC supply voltage is higher than 50 volts as would be the case for rectified voltage from a conventional power line source.

It is another object to provide an improved push-pull inverter circuit in which energy loss due to common-mode conduction of the switching transistors is substantially eliminated.

It is still another object to provide an improved inverter circuit of this general type in which energy loss within each transistor during its turn off transistion is minimized. In this regard, it is important to prevent the collector voltage from rising significantly before the transistor has been turned off completely.

It is still another object to provide an improved inverter circuit effective to minimize energy dissipation which results from turning on a transistor before its collector voltage has been reduced to its minimum level.

It is still another object to provide an improved inverter circuit in which an efficient base drive is provided to minimize power dissipation within each transistor while it is conducting. In this regard the base drive is adequate for this intended purpose without being excessive. This prevents the base drive from becoming a source of energy dissipation in and of itself.

An inverter circuit that eliminates or substantially minimizes all of the loss factors described above is described herein wherein like characters of reference designate like parts of the several views.

BRIEF DESCRIPTION OF THE DRAWINGS

FIG. 3 is a circuit diagram of a modified inverter circuit adapted to operate at higher DC potentials;

FIG. 4 is a schematic diagram of the inverter circuit of FIG. 1 specifically adapted as a ballast for fluorescent lamps; and FIG. 4A is a schematic diagram of a bridge rectifier adapted for use with the circuit of FIG. 4.

DESCRIPTION OF THE PREFERRED EMBODIMENTS

Figure 1:
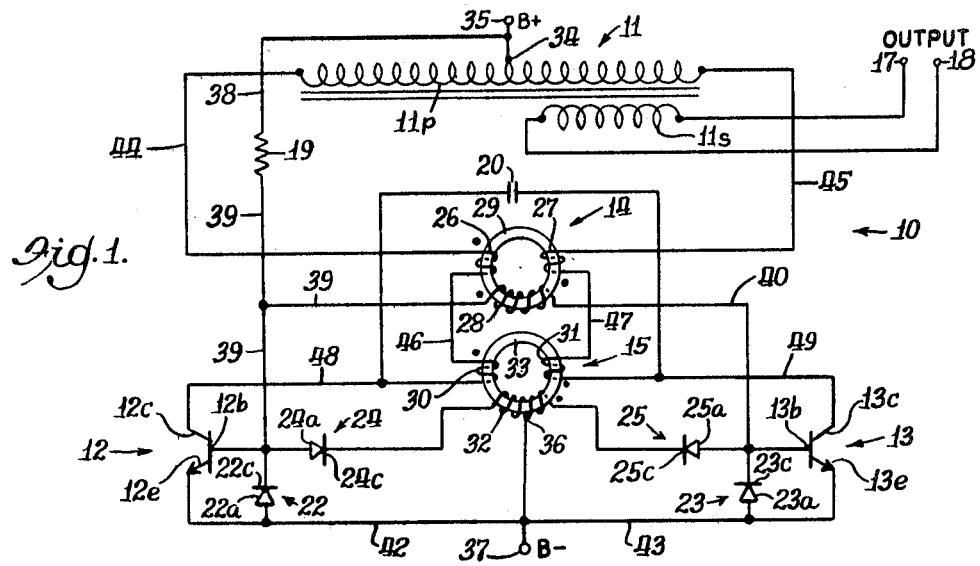
FIG. 1 is a schematic diagram of a preferred embodiment of the inverter circuit of the present invention.

The improved high efficiency inverter circuit of the present invention is illustrated schematically in FIG. 1 and is designated generally by the numeral 10. The circuit 10 comprises a main transformer 11, a pair of relatively high-power switching transistors 12 and 13, a saturable current transformer 14 and a non-saturable current transformer 15. The main transformer 11 has a primary winding 11p and a secondary winding 11s. The secondary winding 11s is connected to deliver a high frequency alternating output voltage to a pair of terminals 17 and 18. The transistor 12 has a base 12b, a collector 12c and an emitter 12e. Similarly, the transistor 13 has a base 13b, collector 13c and emitter 13e.

The inverter circuit 10 also comprises a resistor 19, a capacitor 20 and diodes 22, 23, 24, and 25. The transformer 14 has windings 26, 27 and 28 wound on a torroidal magnetic core 29. Similarly, the transformer 15 has windings 30, 31, and 32 wound on a torroidal magnetic core 33. The primary winding 11p has a center tap 34 connected to a terminal 35 which is connected to a positive source of DC voltage or B+. Similarly, the transformer 15 winding 32 has a center tap 36 connected to a negative terminal 37 or B−. The center tap 34 on the transformer 11 is connected by a lead 38 to one end of the resistor 19, and the other end of resistor 19 is connected by means of the lead 39 to the base 12b of transistor 12. The lead 39 is also connected to one end of winding 28 of transformer 14 and to a cathode 22c of diode 22, and to an anode 24a of the diode 24. The other end of winding 28 is connected by a lead 40 to the base 13b, to a cathode 23c of diode 23 and to an anode 25a of the diode 25. The two ends of winding 32 of transformer 15 are connected to cathodes 24c and 25c. The emitter 12e of transistor 12 is connected by means of a lead 42 to an anode 22a of diode 22 and to the B− terminal 37. Similarly, the emitter 13e of transistor 13 is connected by means of a lead 43 to an anode 23a of diode 23 and to the B− terminal 37.

One end of the primary winding 11p of transformer 11 is connected by means of a lead 44 to one end of the winding 26 of transformer 14. Similarly, the other end of the winding 11p of transformer 11 is connected by means of a lead 45 to one end of the winding 27 on the transformer 14. The other ends of the windings 26 and 27 are connected by means of leads 46 and 47 to the windings 30 and 31, respectively, of the transformer 15. The other end of winding 30 is connected by means of the lead 48 to the collector 12c of transistor 12, and the other end of winding 31 is connected by means of a lead 49 to the collector 13c of transistor 13. The capacitor 20 is connected between the leads 48 and 49.

Figure 2:
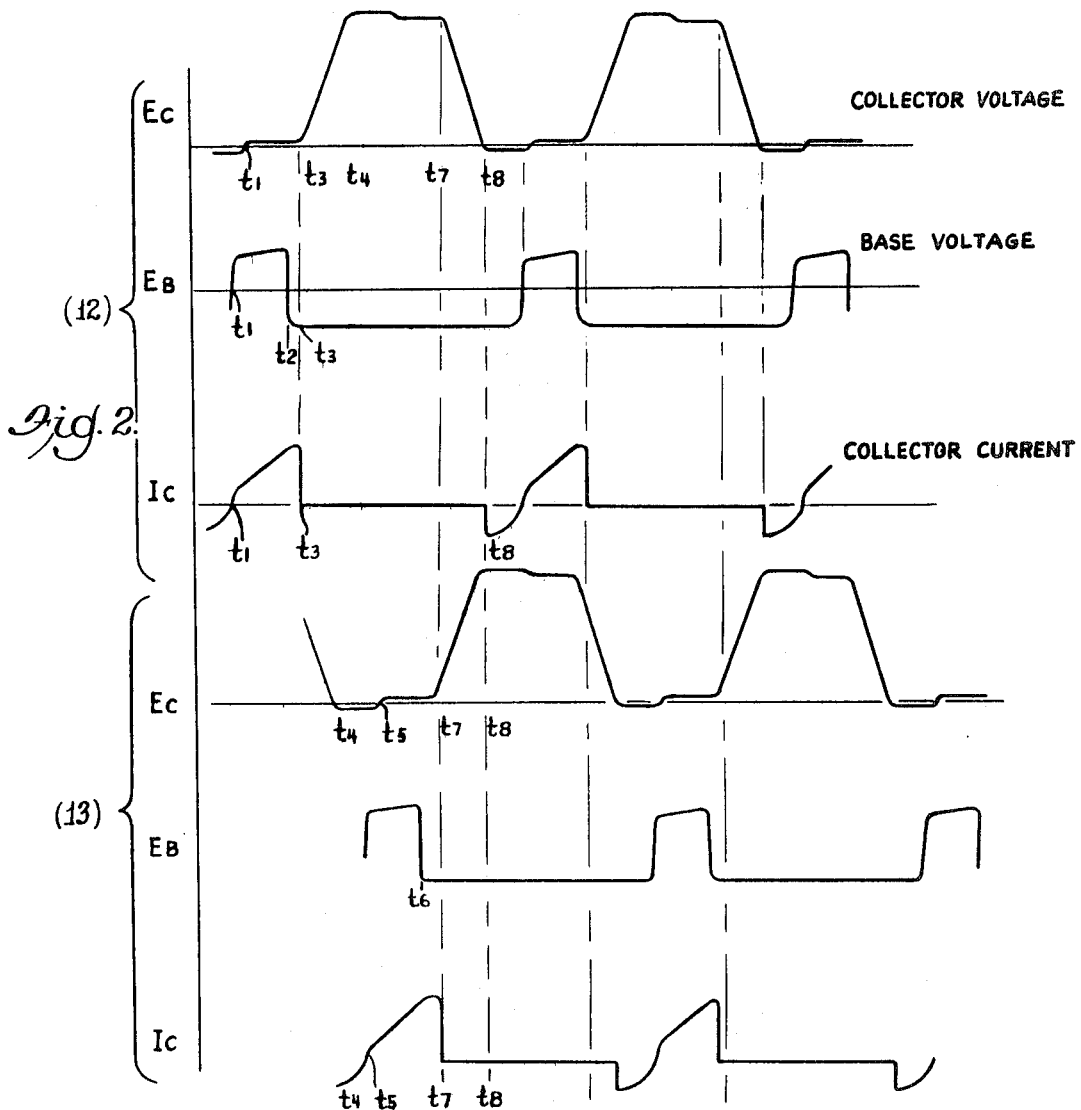
FIG. 2 are characteristic wave form diagrams of the collector voltage, base voltage and collector current for both of the switching transistors of FIG. 1.

The operation of the inverter circuit of FIG. 1 may be described in conjunction with the wave form diagrams of FIG. 2. A positive starting bias signal is provided from B+ through resistor 19 and lead 39 and through winding 28 and lead 40 to the bases 12b and 13b, respectively. This bias current is effective to trigger one or the other of the transistors 12 or 13 into conduction. Assume that transistor 12 is the conducting transistor at the time $t_1$; the base voltage $E_b$ has been driven to a positive state, and the collector current $I_c$ rises. The collector voltage $E_c$ is substantially zero or only slightly positive while the transistor 12 is conducting. Current from B+ flows through the main transformer winding 11p and lead 44 through winding 26 of transformer 14, through winding 30 of transformer 15, and through lead 48, collector 12c, emitter 12e and lead 42 to B−. The current flowing through winding 26 produces a changing flux in the core 29 of transformer 14. So long as this core 29 is not saturated, the winding 28 provides a positive feed-back to the base 12b. The current path from one end of the winding 28 is through lead 39, base 12b, emitter 12e, and lead 42 to B−. A return current path to winding 28 is provided from B− through lead 43, diode 23 and lead 40 to the other end of winding 28.

At some time $t_2$ core 29 becomes saturated and positive feed-back to the base 12b ceases. The winding 28 in effect becomes a short circuit between the bases 12b and 13b. Until the core 29 saturates, the transformer 14 provides the dominant feed-back to the base drive circuit. However, when the transformer core 29 does saturate, the transformer 15 then provides the dominant feedback control. The transformer 15 is designed so that the core 33 is not saturated by the same conditions that cause the transformer 14 to saturate. The winding 32 of transformer 15 provides a subtractive, or negative, feedback through the diode 24 to the base 12b. The implication of this performance is that as soon as the transformer 14 saturates the base drive current reverses, thereby rapidly evacuating the stored charge carriers from the base emitter junction of transistor 12. As soon as the base emitter junction of transistor 12 is evacuated of carriers, the current taken by winding 32 of transformer 15 starts flowing through the diodes 22 and 24 and center tap 36 to B−.

It should be noted that the subtractive feedback which causes the rapid evacuation of the charge carriers from the base emitter junction of transistor 12 prevents any positive voltage transients on the base 13b of the opposite transistor 13. The saturated core 29 of transformer 14 in effect provides a short circuit through the winding 28 between the bases 12b and 13b so that both remain negative. Due to the unidirectionally subtractive current from transformer 15, both base voltages will stay at a negative voltage for as long as current flows through winding 32 of transformer 15, which is for as long as collector current $I_c$ continues to flow. The implication of this is that it does not matter that the transistors 12 and 13 may have significant turn-off delays. The non-conducting transistor simply cannot be turned on until current has stopped flowing through the opposite transistor.

The capacitor 20 connected between the collectors 12c and 13c serves to restrain the rate of rise until time $t_4$ of the collector voltage $E_c$ after the conducting transistor 12 is turned off. As a result, the transistor 12 is turned off completely before its collector voltage rises to any significant level. This greatly minimizes power dissipation in the transistor during the turn-off transition. It should be noted that the capacitor 20 also bridges the windings 30 and 31 of the transformer 15 and provides a path for continuity of current flow through the current feedback transformers 14 and 15.

The main transformer 11 contains some amount of leakage inductance. This inductance in effect provides inertia to the current flow so that the collector voltage $E_c$ on the transistor 12 that is being turned off could rise to a very high level. However, the ultimate voltage that can be reached by the collector of the off-transistor cannot be more than twice the magnitude of B+. From the nature of the circuit, it may be noted that when the collector voltage $E_c$ of one transistor has risen to a magnitude of twice B+, the voltage on the collector of the other transistor has fallen to zero. Also, the collector voltage cannot rise beyond twice the magnitude of B+ because the other transistor 13, in combination with its base to emitter diode, acts as a clamp.

In order to eliminate the turn-on losses entirely, the off-transistor should not be turned on until after its collector voltage has reached zero. This is precisely what is accomplished by the base drive circuits in the operation of the transformers 14 and 15.

The operation of transistor 13 can be described by reference to the lower or second set of wave form diagrams of FIG. 2, which are substantially identical to the upper set shown for transistor 12—only displaced in time. Between time $t_3$ and $t_4$ the collector voltage $E_c$ of transistor 13 decreases to slightly below zero. The rate of decline corresponds to the rate of rise of the collector voltage of the now "off" transistor 12. This rate of change is restraind by the charging of the capacitor 20, and continues until clamping takes place. At time $t_4$, a negative current $I_c$ begins to flow between the base 13b and collector 13c and continues until time $t_5$. The path for this current flow is from B— through diode 23, the base-collector junction of transistor 13, windings 31 and 27, and winding 11p of transformer 11 to B+. This results in a return of energy to the power supply, during this time span. The transistor 13 and diode 23 in this mode function as a clamp to limit the magnitude of the voltage of the collector 12c of transistor 12.

At time $t_5$, the base 13b is driven positive and transistor 13 begins to conduct in a positive direction. The path for this current flow $I_c$ is from B+ through the right half of winding 11p, through windings 27 and 31, collector 13c, and emitter 13e to B—. A positive feedback is provided from winding 28 of transformer 14 to the base 13b. The current $I_c$ continues to flow until time $t_7$, shortly after the transformer 13 saturates at time $t_6$, and positive feedback to the base 13b ceases. At this time, the transformer 15 takes over and supplies a subtractive feedback to the base 13b rapidly evacuating its charge carriers. The transistor 13 is turned off and its collector voltage begins to rise until time $t_8$, completing the cycle of operation.

The alternate conduction of each transistor 12 and 13 produces current flow through winding 11p of transformer 11 in opposite directions. This alternating current in winding 11p is transformed into a high-frequency AC voltage at the secondary winding 11s which is supplied to the output terminals 17 and 18.

Referring now to FIG. 3, the circuit therein illustrated is capable of operating at higher DC potentials for a given voltage limit on the transistors than is the circuit of FIG. 1, although the principles of switching control are substantially the same. The inverter circuit of FIG. 3 is designated generally by the numeral 110 and comprises the main transformer 111, switching transistors 112 and 113, a non-saturable current transformer 114 and a saturable current transformer 115. The circuit 110 also includes a pair of capacitors 116 and 117 connected in series between a B+ terminal 118 and a B— terminal 119. The circuit 110 also includes a capacitor 120, a resistor 121 (or other bias means) and diodes 122 and 123, 124, 125, 126 and 127. The transformer 114 has windings 130, 131, and 132 wound on a toroidal core 133. Transformer 115 has windings 134, 135, and 136 wound on a toroidal core 137. The collector of transistor 112 is connected by means of a lead 140 to the B+ terminal 118. The emitter of transistor 112 is connected to the collector of transistor 113 by a lead 141. The emitter of transistor 113 is connected to a lead 142 which is connected to the B— terminal 119. The transistors 112 and 113 are effectively connected in series between the B+ and B— terminals and their operation is controlled by the base drive circuit which includes the transformers 114 and 115 so as to deliver a high frequency alternating voltage output to the secondary 111s of transformer 111. The transistors 112 and 113 in this embodiment must be capable of withstanding a DC voltage equal to B+ whereas transistors 12 and 13 of FIG. 1 must be capable of withstanding twice B+.

One end of the primary winding 111p of transformer 111 is connected to a junction 145 between the capacitors 116 and 117. The same end of winding 111p is connected to one end of the resistor 121. The other end of resistor 121 is connected by a lead 146 to the anode of diode 125 and to one end of winding 132 on the transformer 114. The other end of winding 132 is connected to a lead 147 which in turn is connected to one end of the winding 136 on the transformer 115 and to the cathode of diode 127. The other end of winding 136 is connected by means of lead 148 to the cathode of diode 123 and to the base of transistor 113.

The other end of winding 111p of transformer 111 is connected by means of a lead 150 to one end of the winding 131 on transformer 114. The other end of winding 131 is connected by a lead 151 to one end of winding 135 on the transformer 115. The other end of winding 135 is connected to lead 141. The lead 141 is connected to the emitter of transistor 112, the collector of transistor 113, the cathode of diode 124, the anode of diode 122, and the anode of diode 126 and to one side of the capacitor 120. The other side of the capacitor 120 is connected to the B— lead 142. One end of the winding 130 of transformer 114 is connected by a lead 155 to the base of transistor 112, to the cathode of diode 122, and to one end of winding 134 of the transformer 115. The other end of winding 130 is connected to the anode of diode 124. The other end of winding 134 of transformer 115 is connected to the cathode of diode 126.

In operation, the circuit of FIG. 3 functions as follows: The total DC potential beween the terminals 118 and 119 is applied across the capacitors 116 and 117, the junction 145 generally being at one-half of the total DC potential; although it is to be understood that the series connection of capacitors 116 and 117 could be a voltage divider of some comparable type. The capacitors 116 and 117 block the passage of DC but readily permit the passage of alternating current. A DC bias is applied from junction 145 through the resistor 121, lead 145, winding 132, lead 147, winding 136, and lead 148 to the base of transistor 113. The transistor 113 is triggered into conduction and current flows from the junction 145 through the primary winding 111p, lead 150, winding 131, lead 151, winding 135, and lead 141 to the collector of transistor 113, and through the emitter of transistor 113 to B−. A return path is provided through the capacitor 117 to the junction 145. The current flowing through winding 135, together with the effect reflected by winding 136, magnetizes the core 137 in one direction. Until this core 137 is saturated, the transformer 115 provides a dominant positive feedback through winding 136 to the base of transistor 113 to maintain this transistor in a state of conduction. At some point in time, the core 137 of tranformer 115 saturates and positive feedback to the base of transistor 113 ceases. At this point, the output of winding 132 of transformer 114 becomes the dominant control and delivers a subtractive feedback for the rapid evacuation of charge carriers from the base of transistor 113. The path for this current being through the windings 136 and 132, diode 125 and partially through diode 127 to B− until the charge carriers are evacuated. Thereafter, the return path is totally through diode 127. The principal function of the transformer winding 132 therefore is to maintain the voltage on the cathode of this diode 127 negative throughout both feedback cycles. The transformer 115 also provides a positive feedback from winding 134 to the base of transistor 112 to trigger this transistor into conduction. In this latter case, current now flows from B+ through lead 140, the collector of transistor 112 and the emitter of 112 to the lead 141, and through the windings 135 and 131, and primary winding 111p to the junction 145. The return path to B+ is provided from the junction 145 through the capacitor 116. The direction of current flow through the windings 131 and 111p during this half cycle is in the opposite direction from that first described when transistor 113 was conducting so that an alternating voltage output is provided at the secondary 111s of the transformer 111. The winding 134 of transformer 115 continues to provide a positive feedback to the base of the transistor 112 to maintain it in conduction. When core 137 becomes saturated, this feedback ceases. Transformer 114 which is not saturated now provides a subtractive feedback to force evacuation of charge carriers from the base of transistor 112 through winding 130 and diode 124 to the emitter connection 141. When the transistor 112 is cut off, the transistor 113 is triggered into conduction by a signal from winding 136 as previously described.

The circuit 110 thus provides an effective means for controlling the conduction of transistors 112 and 113 to provide a high frequency AC voltage output at the secondary 111s of transformer 111. The sequential operation of the saturable transformer 115 and non-saturable transformer 114 ensures that the non-conducting transistor 112 or 113 is not switched on until the conducting transistor is switched completely off. The capacitor 120 connected across the collector and emitter junction of transistor 113 restrains the rate of rise in voltage at the collector of transistor 113 during these transient stages.

When transistor 113 is turned off, the voltage at its collector begins to rise due to the current flowing from the junction 145 through transformer winding 111p and through winding 135. Further due to the inertia effect of the leakage inductance of transformer 111, the collector voltage continues to rise until it is clamped. A current path is then established from the collector of 113 through diode 122 and the base-collector junction of transistor 112 to B+. This negative current continues to flow until the energy stored in the leakage inductance of transformer 111 is discharged and returned to the power supply. This current also conditions the transistor 112 so that for a brief period it can conduct in the positive direction.

The circuit of FIG. 1 can utilize inexpensive and readily available transistors and with such transistors can operate at B+ voltages as high as 300 volts. In the circuit of FIG. 3 DC voltages as high as 600 volts can be accommodated. This would correspond to root mean square voltages from the power line as high as 420 volts, if the power line voltage is directly rectified and used as a B+ supply.

Referring now to a FIG. 4, there is illustrated a circuit diagram of an inverter circuit similar to that of FIG. 1 but specifically adapted for use as a ballast for two 40 watt fluorescent lamps 201 and 202. The circuit as a whole is designated by the numeral 210 and comprises a transformer 211, having a primary winding 211p. Secondary windings 203, 204 and 205 are provided for the filaments of the lamps 201 and 202. A current limiting inductor 206 is connected in series with the lamps 201 and 202 across the primary winding 211p.

The circuit 210 also comprises switching transistors 212 and 213, a saturable transformer 214, a non-saturable transformer 215, a resistor 219 and capacitor 220. The circuit 210 also contains diodes 222, 223, 224, and 225. The transformer 214 has windings 226, 227 and 228 on a toroidal magnetic core 229. Similarly, the transformer 215 has windings 230, 231 and 232 on a toroidal magnetic core 233. A center tap 235 of the primary winding 211p of the main transformer 211 is connected to a B+ terminal; and a center tap 237 of the winding 232 of transformer 215 is connected to a B− terminal.

A rectified DC voltage supply may be provided from a conventional AC source as shown in FIG. 4A. A pair of AC terminals 250 and 251 may be connected to a conventinal 120 volt 60 hertz source across a bridge network 252. The bridge network 252 comprises 4 diodes 253, 254, 255, and 256 connected as shown. An electrolytic capacitor 257 can be connected across the output of the bridge network 252 to provide a filtered DC voltage to the B+ and B− terminals. The components utilized in the circuit 210 may be of the types and values as indicated in the accompanying table.

TABLE I

| | |
|---|---|
| Lamps 201 and 202 | 40 w R.S. Fluorescent |
| Inductor 206 | F41814 Cup Core |
| Transformer 211 | F42213 Cup Cores |
| Transistors 212 and 213 | FT49 |
| Resistor 219 | 67 KΩ |
| Capacitor 220 | 1200 pf. |
| Diodes 222-225 | IN 4001 |
| Core 229 | W40401 TC |
| Core 233 | W40402 TC |

The complete embodiment of the ballast circuit of FIG. 4, utilizing the components as indicated results in an efficient device that is small, light-weight, and compact. The ballast circuit constructed as indicated may have one-tenth or less of the total weight of a conventional ballast and may occupy a volume of one-sixth or less of that of the conventional ballast circuit. The circuit 210 functions in substantially the same manner as the inverter circuit described in FIG. 1 except that a relatively high frequency AC voltage is developed directly across the primary winding on the main transformer rather than across a secondary winding.

It is to be understood that the embodiments shown and described are by way of example only and that many changes may be made thereto without departing from the spirit of the invention. The invention is not to be considered as limited to the embodiments shown and described except insofar as the claims may be so limited.

I claim:

1. In an inverter for producing an AC output voltage from a source of DC voltage connected therewith and having a pair of alternately conducting switching transistors, each having a base and a collector, and being connected with said DC voltage source, an improved drive circuit for said transistors, comprising:

first means connected with the bases of the transistors for alternately providing drive signals thereto, said first means including an output winding of a first current transformer and being responsive to conduction of said transistors for applying a positive feedback signal thereto, said first current transformer having a pair of primary windings respectively connected in circuit with the collectors of said pair of transistors and said positive feedback signal being a current substantially proportional to the sum of the currents conducted through said pair of transistors;

second means also connected with the bases of the transistors for alternately providing drive signals thereto, said second means including an output winding of a second current transformer and being responsive to conduction of said transistors for applying a negative feedback signal thereto having a magnitude less than that of the positive feedback signal, said second current transformer having a pair of primary windings respectively connected in circuit with the collectors of said pair of transistors and said negative feedback signal being a current substantially proportional to the sum of the currents conducted through said pair of transistors; and control means associated with the first means for terminating said positive feedback signal prior to termination of said negative feedback signal.

2. The inverter circuit of claim 1 wherein the output winding of the current transformer providing said positive feedback signal is interconnected between the bases of the transistors through a low resistance path, the resistance of said low resistance path being no greater than the effective resistance of the base-emitter junctions for a given base drive.

3. The inverter circuit of claim 1 wherein said control means includes a saturable inductor connected in circuit with said bases and causing termination of said positive feedback signal when it becomes saturated and an effective short circuit between the bases of the transistors through the output winding of the first current transformer.

4. The inverter of claim 1 wherein said drive circuit and said pair of switching transistors self-oscillate.

5. The inverter circuit of claim 1 including a power output transformer with some shunt leakage inductance, said output transformer being connected in circuit with the collectors of the transistors and one of said terminals of said DC voltage source.

6. In an electrical inverter circuit containing a pair of alternatingly conducting first and second switching transistors, each having a collector and base-emitter junction, and adapted to convert a unidirectional input voltage into a cyclical, trapezoidal shaped, alternating output voltage, the improvement comprising:

control means connected to said transistors and operable to effect alternating periodic conduction thereof, said control means supplying to the base-emitter junction of each transistor a control signal effective to turn on a transistor only after its collector voltage has dropped substantially to its lowest level prior to said control signal being supplied thereto.

7. The electrical inverter circuit of claim 6 wherein:

said control means is operable to turn off a transistor by reversing the control signal supplied to said base-emitter junction.

8. The electrical inverter circuit of claim 7 wherein:

said base-emitter junction has stored charge carriers while conducting, and said control means is effective to turn off a transistor by the force evacuation of charge carriers from said base-emitter junction.

9. The inverter circuit of claim 6 wherein:

said control means includes a current feedback transformer having at least one primary winding connected in circuit with the collectors of said transistors and a secondary winding connected with said base-emitter junctions and operative to supply said control signals.

10. The inverter circuit of claim 6 wherein each of said switching transistors exhibits repetitive periods of admission and non-admission of current into their collectors, and wherein said inverter circuit includes:

load means connected in circuit between said unidirectional input voltage and said switching transistors, said load means being operative to provide said alternating output voltage at an output and having inductive characteristics operative to cause current in the load means to flow at a substantially unchanged magnitude for at least a brief period after a change in the magnitude of any voltage applied thereto;

whereby, each time after the first transistor stops admitting current of a given magnitude into its collector, the second transistor will start its conduction period with a current of substantially the same given magnitude flowing out of its collector.

11. The inverter circuit of claim 10 wherein:

said load means stores sufficient inductive energy in its leakage inductance to cause the voltage at the collector of a first non-conducting transistor to rise to the level twice the magnitude of the unidirectional input voltage.

12. The inverter circuit of claim 6 wherein:

said control means function to render the inverter circuit self-oscillating.

13. The inverter circuit of claim 6 including:

a shunting diode connected across the base-emitter junction and at each transistor.

14. The inverter circuit of claim 6 including:

first and second diodes respectively shunting the base-emitter junctions of said first and second transistors, each of said first and second diodes being operable to function as a clamp to respectively limit the voltage rise at the collector of said second and first transistors to twice the magnitude of the unidirectional input voltage.

15. An inverter circuit operable to convert a DC input voltage to an AC output voltage and comprising:

a first and second semiconductor switch means each having a first and second control terminal and a first and second switched terminal, said first and second switch means being rendered conductive by application to said first and second control terminal of a positive voltage and rendered non-conductive by application to said first and second control terminal of a negative voltage, all respectively; load means connected in circuit between said DC input voltage and said switched terminals, said load means comprising a first transformer means having a magnetic core; and switching control means connected in circuit with said switched terminals and said control terminals and effective through net positive feedback to provide a first control signal to said first control terminal and a second control signal to said second control terminal, thereby to cause alternating periodic switching of said switch means, thereby giving rise to periodic substantially trapezoidal voltage waveform at said first switched terminal, said switching control means being magnetically non-coupled with said first transformer means, said voltage waveform being characterized by having a period consisting of four time segments of substantially different characters: a first time segment during which the magnitude of the voltage at said first switch means is substantially constant and of relatively small magnitude, a second time segment during which the magnitude of the voltage at said first switch means is rising at a relatively rapid rate, a third time segment during which the magnitude of the voltage at said first switch means is substantially constant and of relatively large magnitude, and a fourth time segment during which the magnitude of the voltage at said first switch means is falling at a relatively rapid rate; said first control signal being characterized by providing to said first control terminal a positive voltage of substantially constant magnitude during a certain part of said first time segment and a negative voltage of substantially constant magnitude during all of the remainder of said period.

16. The inverter circuit of claim 15 wherein said switching control means comprises a saturable inductor means connected in circuit with said control terminals and effective in determining the duration of said certain part.

17. The inverter circuit of claim 16 wherein said switching control means comprises a second transformer means connected in circuit with said switched terminals and with said control terminals and adapted to provide positive feedback.

18. The inverter circuit of claim 17 wherein said second transformer means comprises said saturable inductor means.

19. The inverter circuit of claim 18 wherein said switching control means also comprises a third transformer means connected to circuit with said switched terminals and with said control terminals and adapted to provide negative feedback, the positive feedback being predominant for as long as the saturable inductor means operates in its unsaturated state, said negative feedback being predominant whenever said saturable inductor means operates in its saturated state.

20. The inverter circuit of claim 15 wherein said switching control means comprises a second and a third transformer means both connected in circuit with said control terminals and both responsive to the difference between any currents flowing into said switched terminals, said second transformer means comprising saturable inductor means and providing positive feedback, said third transformer means being non-saturable and providing negative feedback.

21. The inverter circuit of claim 20 wherein said negative feedback is provided to each of said control terminals on an intermittent basis.

22. An inverter circuit operable to convert a DC input voltage to an AC output voltage and comprising:

a first and second semiconductor switch means each having a first and second control terminal and a first and second switched terminal, said first and second switch means being rendered conductive by application to said first and second control terminal of a positive voltage and rendered non-conductive by application to said first and second control terminal of a negative voltage, all respectively; load means connected in circuit between said DC input voltage and said switched terminals; and switching control means connected in circuit with said switched terminals and said control terminals and effective through positive feedback to provide a first control signal to said first control terminal and a second control signal to said second control terminal, thereby to cause alternating periodic switching of said switch means, thereby giving rise to a periodic substantially trapezoidal voltage waveform at said first switched terminal, said voltage waveform being characterized by having a period consisting of four time segments of substantially different characters: a first time segment during which the magnitude of the voltage at said first switch means is substantially constant and of relatively small magnitude, a second time segment during which the magnitude of the voltage at said first switch means is rising at a relatively rapid rate, a third time segment during which the magnitude of the voltage at said first switch means is substantially constant and of relatively large magnitude, and a fourth time segment during which the magnitude of the voltage at said first switch means is falling at a relatively rapid rate; said first control signal being characterized by providing to said first control terminal a positive current during a certain part of said first time segment and a negative current during at least part of the remainder of said first time segment, said positive and negative currents both being substantially proportional in magnitude to the difference between any currents flowing into the two switched terminals.

23. The inverter circuit of claim 22 wherein said switching control means comprises a saturable inductor means connected in circuit with both of said switched terminals and with both of said control terminals and operative to determine the duration of said certain part.

24. The inverter circuit of claim 22 wherein said switching control means comprises a first and a second transformer means both connected in circuit with said control terminals and both responsive to the difference between any currents flowing into said switched terminals, said first transformer means comprising saturable inductor means and providing positive feedback, said second transformer means being non-saturable and intermittently providing negative feedback.

25. In an electrical inverter circuit for producing an AC output voltage from a source of DC voltage, said circuit having a power transformer with an input coil wound around a magnetic core and connected with the DC voltage source through a pair of alternatingly conducting switching transistors, each of which has a control input element and a switched output element, the improvement comprising:

saturating transformer connected in circuit with said switched output elements and with said control input elements and being operative through positive feedback to effect inverter oscillation by way of supplying alternatingly positive and negative drive pulses to the control input element of each transistor, the duration of each of said positive drive pulses being determined by the saturation characteristics of said saturating transformer and being shorter than half the period of said AC output voltage, said positive feedback only taking place during periods when said saturating transformer means is operating in a non-saturated state, whereby said positive drive pulse only exists during part of said half period, said saturating transformer means being magnetically non-coupled with said power transformer; and non-saturating transformer connected in circuit with said switched output elements and with said control input elements and being operative to aid in the effective turn-off of said switching transistors by providing negative feedback to said control input elements during periods when said saturating transformer is operating in a saturated state, said non-saturating transformer being magnetically non-coupled with said saturating transformer.

26. For an inverter operable to produce a periodic AC voltage at an output from a DC voltage provided at an input, where said inverter comprises at least one semiconductor switch means with a control terminal, where a positive current provided to said control terminal tends to cause said switch means to conduct and a negative current provided to said control terminal tends to cause said switch means to prevent conduction, where a complete period of said AC voltage is characterized by having four substantially different portions: a first portion of relatively low and substantially constant magnitude, a second portion of relatively rapidly increasing magnitude, a third portion of relatively high and substantially constant magnitude, and a fourth portion of relatively rapidly decreasing magnitude, and where said output is connected in circuit with an energy-storing inductor means, an improved drive circuit comprising:

first drive means connected in circuit between the output and the control terminal and operative to provide positive feedback from the output to the control terminal, said positive feedback being operative to provide a positive current to the control terminal only during part of the first portion of said complete period, this positive current being terminated before the onset of the second portion of said complete period; and second drive means connected in circuit between the output and the control terminal and operative to provide intermittent negative feedback from the output to the control terminal, said negative feedback being operative to provide only negative current to the control terminal, this negative current being provided immediately after the positive current has been terminated and lasting at least until the onset of the second portion of said complete period.

27. The improved drive circuit of claim 26 wherein the net current provided to the control terminal is the sum of the current provided by said first drive means and the current provided by said second drive means.

28. The improved drive circuit of claim 26 wherein said first drive means comprises a saturating transformer coupled in circuit between said output and said control terminal.

29. The improved drive circuit of claim 28 wherein said saturating transformer is magnetically non-coupled with said energy-storing inductor means.

30. The improved drive circuit of claim 26 wherein said second drive means comprises a non-saturating transformer coupled in circuit between said output and said control terminal.

31. The improved drive circuit of claim 30 wherein said non-saturating transformer is magnetically non-coupled with said energy-storing inductor means.

32. The improved drive circuit of claim 26 wherein said second drive means comprises rectifier means coupled in circuit with said control terminal and operative to prevent said second drive means from providing positive current to said control terminal.

33. The improved drive circuit of claim 26 wherein said semiconductor switch means comprises a transistor.

34. The improved drive circuit of claim 33 wherein said transistor has a base-emitter junction, and wherein a diode is connected directly across said base-emitter junction.

35. The improved drive circuit of claim 34 wherein said transistor is of an NPN type and has a base terminal and an emitter terminal, wherein said diode has an anode terminal and a cathode terminal, and wherein the cathode terminal is connected with the base terminal and the anode terminal is connected with the emitter terminal.

* * * * *